United States Patent [19]

Lewallen et al.

[11] Patent Number: 4,764,899

[45] Date of Patent: Aug. 16, 1988

[54] WRITING SPEED IN MULTI-PORT STATIC RAMS

[75] Inventors: Kent D. Lewallen, Cupertino; Steven J. Schumann, Santa Clara, both of Calif.

[73] Assignee: Advanced Micro Devices, Inc., Sunnyvale, Calif.

[21] Appl. No.: 827,994

[22] Filed: Feb. 7, 1986

[51] Int. Cl.$^4$ ................................................ G11C 7/00

[52] U.S. Cl. .................... 365/189; 365/190; 365/203

[58] Field of Search ............... 365/189, 190, 154, 203

[56] References Cited

U.S. PATENT DOCUMENTS

| | | | |
|---|---|---|---|
| 4,499,559 | 2/1985 | Kurafuji | 365/190 |
| 4,541,076 | 9/1985 | Bowers et al. | 365/189 |
| 4,578,780 | 3/1986 | Baba | 365/190 |
| 4,580,245 | 4/1986 | Ziegler et al. | 365/190 X |
| 4,623,990 | 11/1986 | Allen et al. | 365/230 X |
| 4,636,983 | 1/1987 | Young et al. | 365/190 X |
| 4,644,500 | 2/1987 | Yonezu et al. | 365/190 X |

OTHER PUBLICATIONS

Kendall W. Pope—"Asynchronous Dual Port RAM Simplifies Multiprocessor Systems", Electronic Design News, Sep. 1, 1983.

Primary Examiner—Stuart N. Hecker
Assistant Examiner—Alyssa Bowler
Attorney, Agent, or Firm—Patrick T. King; Robert K. Stoddard; Eugene H. Valet

[57] ABSTRACT

A write-bias gate in the form of an FET is provided for each of the bit-lines. Each FET has its drain electrode connected to logic 1 and its source electrode connected to the bit-line. When one port is writing, the write-bias gates on the other port(s) are driven by a signal which causes them to enter a pass condition, supplying extra current to pull up the bit lines of the non-writing port(s).

19 Claims, 2 Drawing Sheets

WRITING SPEED IN MULTI-PORT STATIC RAMS

BACKGROUND OF THE INVENTION

This invention relates generally to the field of matrix-array, read-write, randomly accessible memory devices (RAMs), more particularly to the design of a memory cell for use in a multi-port static RAM memory, and especially to overcoming certain limitations on the speed with which such cells can be written with data.

In the quest to increase the speed of digital computers, the use of multiple data processors has become increasingly significant. Since microprocessors have vastly reduced the cost of computing power, distribution of the multiple computational tasks among multiple processing units has become practical.

However, the multiple processing units must in many instances share access to data stored in the memories of the computer. Since the read-write RAM memories of the computer will typically be accessed very frequently by more than one processing unit in such a multi-processor environment, adequate management of these memories to avoid contentions and errors becomes a vital concern.

The first multi-port static RAMs to appear are dual-port, although RAMs having three or more ports may very well appear in the future. The dual-port static RAM (SRAM) which has already evolved eases some of the management problems involved in the sharing of memory among multiple processors. In the dual-port SRAM, each of the memory cells may be accessed by either or both of two identical ports, conventionally called the left and right ports, each of which can access the cell for read and write operations. While the provision of two such ports eases the problem of contentions and avoids a requirement to provide a queued management scheme for access to the memory, certain problems still remain.

In particular, it has been noted that the operation of writing data into a memory cell proceeds more slowly when the row on which the cell is located is being accessed simultaneously by each of the two ports. Since the processing units accessing the memory may be operated asynchronously, the occurrence of this "common-row write problem" is not easily predicted. Consequently, additional time must be allowed for any write operation, and the speed of the memory device suffers.

As will appear from the discussions later in this patent application, the common-row write problem arises fundamentally from insufficient ability of the prior-art memory cell to raise the voltage on its bit-lines to a logic 1 level, compared to the speed with which this voltage can be dropped to a logic 0. This problem arises basically from the greater parasitic capacitance associated with the dual-port design.

While a number of alternatives exist for overcoming this problem, as by increasing the ability of the write drivers to deliver current, by increasing the size of the "pull-up" gates on the bit-lines, or by increasing the size (and hence decreasing the resistance) of the word-line pass gates, these solutions all involve degradation of some other performance criterion to an unacceptable degree. In particular, excessive increases in current consumption and power dissipation, or in the physical size and capacitance of each cell are often involved.

DESCRIPTION OF THE RELATED ART

An early dual-port SRAM was described in an article entitled "Asynchronous dual-port RAM simplifies multiprocessor systems" by Kendall W. Pope in the Sept. 1, 1983 issue of "Electronic Design News" magazine. While the device of this article is a workable dual-port SRAM design, it suffers from the common-row write problem addressed by the present invention, and is far from optimum in performance, especially in writing speed.

SUMMARY OF THE INVENTION

An object of the present invention is to provide a design for a memory cell for use in a dual-port SRAM in which the speed of writing data into the cell is improved over known designs.

A second object of the present invention is to provide a design for a memory cell having improved ability to raise the voltage on its bit-lines from a logic 0 to a logic 1.

A third object of the present invention is to achieve the foregoing objects without a substantial increase in current consumption or power dissipation in a dual-port SRAM.

A fourth object of the present invention is to improve the speed of writing data from one port into a cell of a dual-port SRAM without causing any appreciable interference with the write or read operation being carried out by the other port.

To the above ends, a dual-port SRAM memory cell according to the present invention includes a gated write-bias means associated with each of its two ports and driven with a voltage which turns the write-bias means on during a write operation. The write-bias means associated with each port is connected to supply current to the bit-line(s) of the opposite port to aid in raising the voltage of those bit-line(s) which must go HIGH in accordance with data being written into the memory cell(s).

The above and other features, objects and advantages of the present invention together with the best mode known to the inventors thereof for carrying out their invention will become more apparent from reading the following description of a preferred embodiment of the invention and from studying the associated drawing, in which:

DETAILED DESCRIPTION OF THE PRESENT INVENTION

Figure 1:
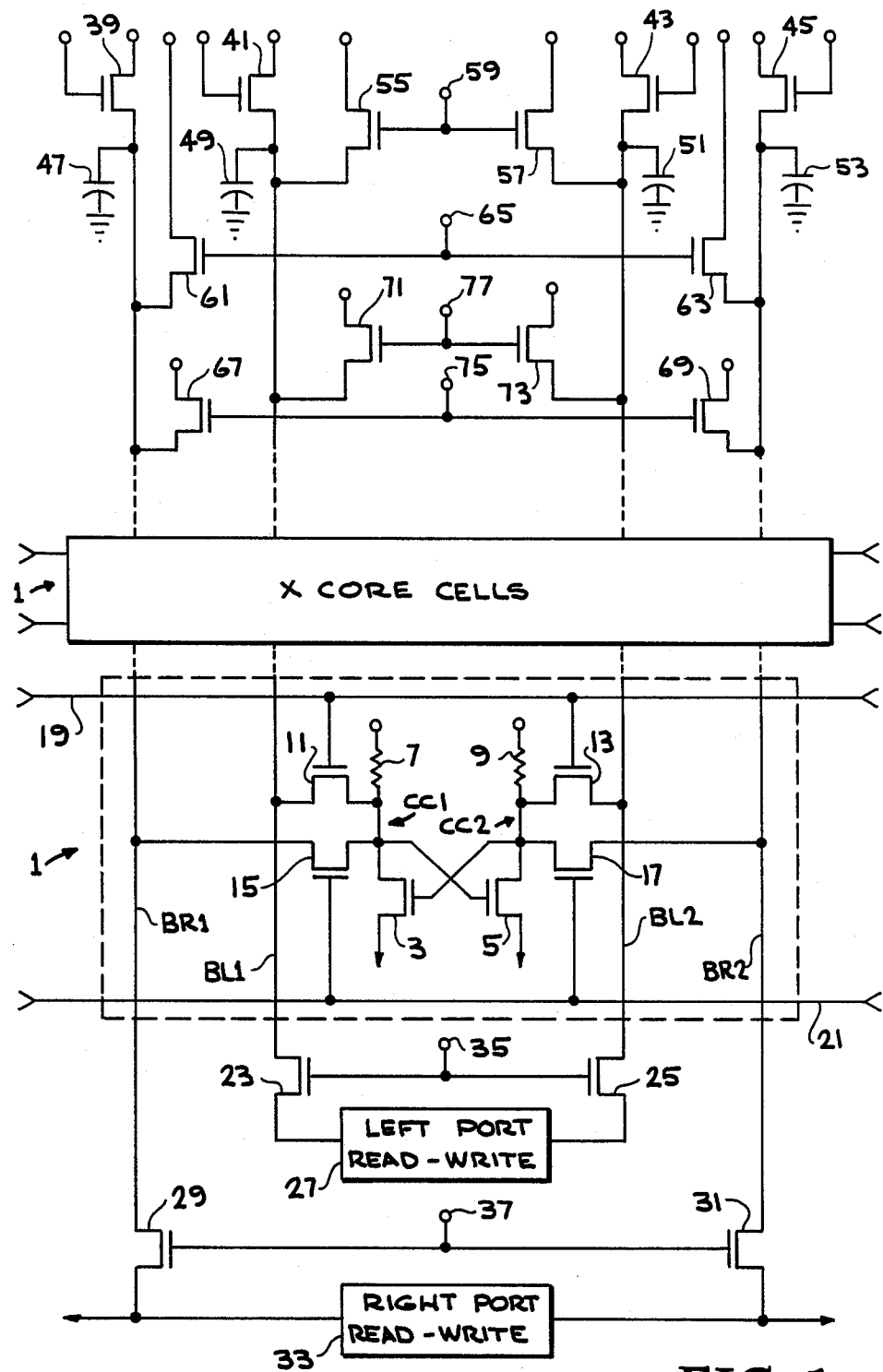
FIG. 1 is a schematic diagram partly in block representation of an SRAM memory cell and bit-lines according to the present invention.

In FIG. 1, the circuit of a dual-port memory cell 1 according to the present invention is shown, together with the necessary associated circuit elements and data lines which would be present in a matrix-array read-write memory having many such cells. For example, the entire memory array might consist of a matrix having 128 rows and 64 columns, defining 128×64 or 8K matrix bit locations, at each of which a cell like memory cell 1 would be situated.

At its heart, cell 1 stores a single bit of data in a core cell in the form of a bistable flip-flop circuit composed of field-effect transistors (FETs) 3 and 5, the gate, source and drain electrodes of which are labeled G, S, and D in FIG. 1, and a pair of load devices 7 and 9. The drain electrode of each FET is connected to a source of positive or logic HIGH voltage, for example, 5 volts, through its associated load resistor 7 or 9. The source electrodes are connected to a circuit ground or logic LOW voltage, for example, 0 volts, as symbolized by the arrowhead symbol used throughout the circuit of FIG. 1.

As illustrated by the drawing, the gate of transistor 3 is connected to the drain of transistor 5, and the gate of transistor 5 is connected to the drain of transistor 3. As is well known, such a circuit will assume either of two stable operational states when power is applied. Either FET 3 will conduct while FET 5 is cut off, or FET 5 will conduct while FET 3 is cut off.

If FET 3 is cut off and FET 5 is on, then a complementary pair of output terminals CC1 and CC2 will have logic 1 and 0 signals, respectively, imposed on them by the core cell 1. Throughout the remainder of this patent application, such a state will be taken to represent a logic 1 bit stored in the memory cell, while the opposite state which exists when FET 3 is on and FET 5 is off will be taken to represent a logic 0 bit stored in cell 1.

The bit of data stored in cell 1 will remain stable so long as power is applied to the circuit, and can be read or rewritten only by deliberately accessing the core cell for these purposes. A pair of left-port pass gates 11 and 13 in the form of FETs connect terminals CC1 and CC2 with a complementary pair of left-port bit-lines BL1 and BL2, respectively. Similarly, a pair of right-port pass gates 15 and 17 in the form of FETs connect terminals CC1 and CC2 with a complementary pair of right-port bit-lines BR1 and BR2, respectively.

The gate voltages of transistors 11 and 13 are controlled by a left-port word-select line 19, which is conventionally a row line of the matrix-array memory device. In order to access cell 1 from the left port, word-select line 19 is raised to a logic 1 level, which might be nearly 5 volts. Under this condition, gates 11 and 13 will each enter a "pass" or conductive condition to a degree which is sufficient to approximately equalize the voltages on terminal CC1 and bit-line BL1, and to approximately equalize the voltages on terminal CC2 and bit-line BL2.

Similarly, the gate voltages of transistors 15 and 17 are controlled by a right-port word-select line 21, which is conventionally a row line of the matrix-array memory device. In order to access cell 1 from the right port, word-select line 21 is raised to a logic 1 level. Accordingly, BR1 and BR2 will approximately duplicate the voltages on their associated core-cell terminals CC1 and CC2 for the reasons stated in the preceding paragraph.

In accordance with the foregoing, the data in the core cell of memory cell 1 can be independently communicated with the left-port bit-lines or the right-port bit-lines by shifting the control voltages on the respective left- and right-port word-select lines 19 and 21 between logic 0 and logic 1 levels.

The data in the core cell remains isolated from the output of the memory array until a pair of left-port bit-line pass gates 23 and 25 communicate the signals with a left port read-write circuit 27, or until a pair of right-port bit-line pass gates 29 and 31 communicate the signals with a right port read-write circuit 33. As in the case of gates 11–17, gates 23, 25, 29 and 31 are formed as FETs having their source and drain electrodes connected in a series-circuit relationship to make it possible to pass signal voltages when their gate electrodes are at a logic 1 level, and to isolate these voltages when their gate electrodes are at logic 0.

A left-port column-select input 35 controls the voltage on the gate electrodes of pass gates 23 and 25, and a right-port column-select input 37 controls the voltage on the gate electrodes of pass gates 29 and 31. Inputs 35 and 37 are conventionally the column-select lines of a matrix-array memory device, and they control access through pass gates 23, 25, and 29, 31 by shifting the voltages on the respective gate electrodes between logic 1 and 0 levels as in the case of word-select lines 19 and 21.

Each of the read-write circuits illustrated schematically in blocks 27 and 33 includes a differential sense amplifier to read the data in a cell during a read operation and a write driver to write new data into the cell. When pass gates 11–17 and 23, 25, 29, and 31 are in a no-pass condition, the potentials on all four bit-lines are maintained at approximately a logic 1 level by four bit-line leaker gates 39, 41, 43, and 45.

The gate and drain electrodes of these leakers are all connected to a source of logic 1 voltage, such as about 5 volts, while the source electrodes of each connect to one of the bit-lines. Consequently, when all of the pass gates are in a no-pass condition, leakers 39–45 will cause the potential on each bit-line to rise to nearly a logic 1 level. Leakers 39–45 are capable of supplying enough current to overcome normal losses of voltage on the bit-lines due to diode leakage, but are not sufficient to raise the voltage on these lines from 0 to 1 in the event that a turned-on transistor is pulling them down to 0.

Capacitors 47, 49, 51, and 53 are shown connected one to each of the four bit-lines in FIG. 1. Although shown as lumped capacitance, these capacitors actually represent all of the unavoidable parasitic capacitance associated with each of the bit-lines. Since the bit-lines are conventionally the column lines of the matrix-array, each of them extends to all the memory cells in one column and has considerable capacitance. Consequently, this capacitance constitutes a significant impediment to rapid changes in the voltage on the bit-lines and requires that certain minimum levels of current capacity be met during pull-up or pull-down of the bit-lines.

A pair of left-port pre-charge gates 55 and 57 are formed as FETs having their source and drain electrodes connected between a source of logic 1 voltage and bit-lines BL1 and BL2. A left pre-charge terminal 59 is connected in common to the gate electrodes of gates 55 and 57. As will become more apparent from the discussion of FIG. 2 which follows, a logic 1 pre-charge signal from an external signal source (not shown) is applied briefly to this terminal when there is a change of row address on the left port.

Similarly, a pair of right-port pre-charge gates 61 and 63 are formed as FETs having their source and drain electrodes connected between a source of logic 1 voltage and bit-lines BR1 and BR2. A right pre-charge terminal 65 is connected in common to the gate electrodes of gates 61 and 63. As in the case of the left port, a pre-charge signal is applied briefly to this terminal when there is a change of row address on the right port.

In order to understand the operation of the circuit as thus far described, an example of a left-port read operation is presented as an illustration. However, because of the electrical symmetry of the circuit of FIG. 1, the same description could equally well apply to a read operation conducted from the right port.

The memory cell of FIG. 1 is accessed for either a read or write operation from the left port whenever the left-port word-select line 19 goes HIGH (i.e., to logic 1) and the left-port column-select input 35 also goes HIGH. A row address decoder (not shown) causes word-select line 19 to go HIGH when the cell is addressed from the left port, while a similar column address decoder (not shown) causes column-select input 35 to go HIGH. A row-address-driven pre-charge pulse generator (not shown) also briefly applies a logic HIGH signal to left pre-charge terminal 59 to charge the bit-lines BL1 and BL2 up to a logic 1 at the start of the read operation.

If the core cell contains a logic 1 bit, then terminal CC1 will be HIGH and terminal CC2 will be LOW. Therefore, the conductive path from terminal CC1 through pass gate 11 will cause no appreciable change in the voltage on bit-line BL1, which was already HIGH. However, the conductive path from terminal CC2 through pass gate 13 to bit-line BL2 causes the voltage on BL2 to be pulled down through FET 5 which is conducting.

Pass gates 23 and 25 are placed in a pass condition by the logic 1 signal applied to column-select input 35, so the logic 1 bit in memory cell 1 is passed to the differential sense amplifier (not shown) in read-write circuit 27. The reading of this bit is actually complete before the voltage on BL2 has been pulled down to a 0 level, since the differential sense amplifier responds to very small voltage differences between the bit-lines connected to it.

A write operation conducted from the left port also begins by accessing the row and column of cell 1 via word-select line 19 and column-select input 35. Pass gates 11 and 13 then connect terminals CC1 and CC2 to bit-lines BL1 and BL2 while gates 23 and 25 connect BL1 and BL2 to read-write circuit 27. Let us assume that cell 1 holds a logic 1 bit at the start of this write operation, and that the cell is to be rewritten to a logic 0. Terminal CC1 is initially HIGH while terminal CC2 is LOW and accordingly, FET 3 is cut off while FET 5 is on and conducting.

In order to write cell 1 to the new logic 0 data, read-write circuit 27 applies a logic 0 (LOW) voltage through FET 23 to bit-line BL1 and a logic 1 to bit-line BL2 through FET 25. The logic 0 applied to BL1 is transferred through pass gate 11 to terminal CC1 which quickly drops to near 0, turning off FET 5. The logic 1 applied to BL2 by circuit 27 quickly raises the voltage on the drain electrode of FET 5, turning FET 3 on. The conductive path through FET 3 to a 0 or ground level maintains the LOW or logic 0 on terminal CC1. At this point, the new data in cell 1 is securely written and the write operation is complete.

The foregoing description of a write operation is the same as a write operation carried out in a single-port memory cell, and neglects any consequences arising from operations on the right port. Such a description is accurate so long as the right port does not access the row on which cell 1 is located during the write operation, since pass gates 15 and 17 effectively isolate right-port bit-lines BR1 and BR2 from terminals CC1 and CC2.

However, if the right port is accessing any cell on the row on which cell 1 is located, word-select line 21 will be HIGH and pass gates 15 and 17 will connect terminals CC1 and CC2 to right-port bit-lines BR1 and BR2. Under these conditions, the write operation cannot be complete until bit-lines BR1 and BR2 have also been brought to approximately equal voltage levels as will become clearer in the discussion of FIG. 2 below. BR1 and BR2 thus represent additional capacitance which must be brought to new voltage levels. This task is complicated by the significant resistance represented by gates 15 and 17.

In the device as thus far described, this "common-row write problem" has been a significant limitation on the speed of writing data into the memory, and has thus caused the speed or cycle-time of dual-port SRAMs to be significantly slower than that of conventional single-port SRAMs.

In accordance with the present invention, this common-row write problem can be solved by the provision of a gated write-bias means directly connected to the bit-line whose voltage potential must be raised to a logic 1. Such a means can supply sufficient additional current to the bit-line to increase the rate at which the voltage potential rises and thus restore the speed lost in writing the dual-port memory cell of FIG. 1.

In FIG. 1, such a gated write-bias means has been illustrated as four write-bias gates in the form of FETs 67, 69, 71, and 73. FETs 67 and 69 have their drain terminals connected to a source of logic 1 voltage and their source terminals connected to bit-lines BR1 and BR2. Similarly, FETs 71 and 73 have their drain terminals connected to a source of logic 1 voltage and their source terminals connected to bit-lines BL1 and BL2.

The gate terminals of FETs 67 and 69 are driven from a common left-port write-bias terminal 75, and the gate terminals of FETs 71 and 73 are driven from a common right-port write-bias terminal 77. In operation, a logic HIGH signal is applied to terminal 75 when writing from the left port and a logic HIGH signal is applied to terminal 77 when writing from the right port. Both terminals 75 and 77 are held low at other times.

The above described write operation in which the left port writes a 0 into cell 1 would thus be accompanied by the application of an additional source of HIGH bias to both right-port bit-lines, BR1 and BR2. In the event of simultaneous access from the right port during the left-port write operation, write-bias gate 69 supplies sufficient additional current directly to bit-line BR2 to rapidly bring it up to a level high enough to ensure that the cell remains written.

The additional current supplied to bit-line BR1 actually delays its drop to a LOW level as required by the new data being written into the cell. However, this delay does not significantly influence the speed of the write operation since FET 3 has ample capacity to pull BR1 down, and the time required to raise the voltage of BR2 remains the controlling factor.

It will be understood from the foregoing description of the operation of the gated write-bias means of the present invention that it functions in operation in the manner of a switch having a closed state, corresponding to the pass condition of the write-bias gates, and an open state, corresponding to the no-pass condition of the write-bias gates.

Figure 2:
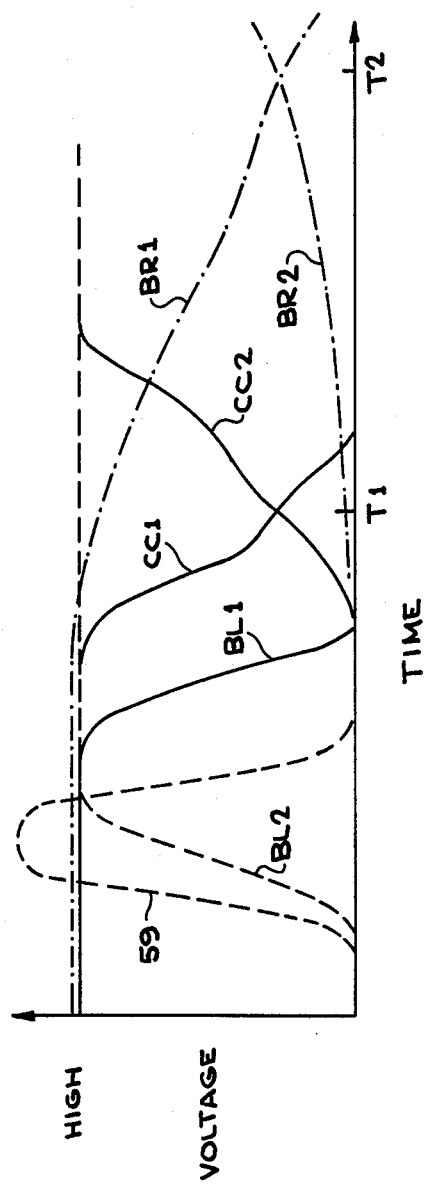
FIG. 2 is a plot illustrating the electrical performance of a dual-port SRAM cell prior to incorporation of a gated write-bias means according to the present invention.
Figure 3:
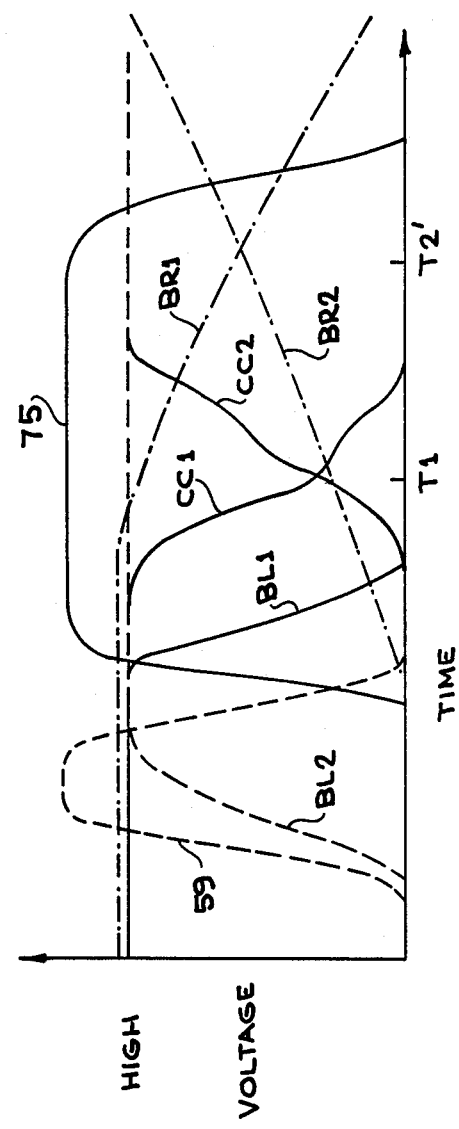
FIG. 3 is a plot illustrating the electrical performance of a dual-port SRAM cell having a gated write-bias means according to the present invention.

Turning now to FIGS. 2 and 3, the write performance of the memory cell of FIG. 1 is illustrated. In each of these figures the curves are plots of voltage versus time, each plot being labeled with a legend corresponding to the reference numbers of the various nodes and terminals of FIG. 1.

FIG. 2 shows the voltages on various terminals of FIG. 1 as a function of time during the operation of writing cell 1 to a logic 0 data bit from the left port. As in the foregoing discussion of this same write operation, the conditions are that the cell initially holds a logic 1 data bit and has been simultaneously accessed by the right port.

A brief pre-charging signal is first applied to terminal 59 to restore the HIGH voltages on the bit-lines of the left port. Accordingly, the voltage on BL2, which had been LOW due to accessing a LOW core-cell terminal on another row, rises rapidly to a HIGH level. Next, the voltage on BL1, driven by read-write circuit 27, falls rapidly. This falling voltage is coupled to terminal CC1 through pass gate 11. Consequently, the voltage on CC1 soon begins to fall also.

The voltage on CC2, driven by current supplied from read-write circuit 27, next begins to rise toward a HIGH level. BR1, which is separated from the drive supplied by circuit 27 by the resistance of pass gates 23, 11 and 15, begins to fall in voltage. As FET 3 begins to conduct more heavily, it increases the rate of fall in the voltage on BR1.

Finally, BR2, which is separated from the drive of circuit 27 by the resistance of pass gates 23, 13 and 17, starts to rise in voltage. However, the drive from circuit 27 is not aided to any significant extent by the logic 1 signal on the drain of FET 5 since the only source of current pulling this terminal up is load resistor 9 which is much too large to supply any appreciable current. Consequently, the slope of the rise in BR2 voltage is quite shallow.

The write operation cannot be considered complete until the write voltage supplied by circuit 27 can safely be removed without risk that the new data in cell 1 is unstable. The initial voltages on bit-lines BR1 and BR2 are of a sense that they could rewrite the cell to its original logic 1 data if the write voltage were removed too soon.

At time T1 for example, the core cell itself reflects the new data, as indicated by the crossover of the CC1 and CC2 plots in FIG. 2. However, if write voltage were removed at this time the voltages on BR1 and BR2, supported as they are by the substantial capacitance of these bit-lines, very likely would flip the core cell back to its original logic 1 data bit.

At time T2 the voltages on bit-lines BR1 and BR2 are crossing over, such that there is no longer any possibility that they could rewrite the core cell. The actual point when the new data is secure in the core cell is somewhat prior to time T2, which is a conservative measure of the time of write completion.

As FIG. 2 clearly illustrates, completion of this commonrow write is delayed principally by the rather shallow slopes of the plots of voltage on BR1 and BR2. The rise in the voltage on BR2 is particularly leisurely, as indicated by the fact that the T2 crossover point with the voltage on BR1 occurs much nearer to a 0 than a 1 voltage level.

FIG. 3 shows plots of the same voltages as shown in FIG. 2 with the exception that the effect of the gated write-bias circuit of the present invention is illustrated. As shown in FIG. 3, gate terminal 75 receives a logic HIGH voltage starting prior to the time when the core cell has changed state and continuing until the data is securely written into the memory cell 1.

The effect of the current consequently supplied by gates 67 and 69 is to cause a very appreciable increase in the slope of voltage on BR2 while causing little perceptible decrease in the slope of the voltage on BR1. Consequently, the crossover of these plots occurs at a time T2' which is considerably shorter than time T2. As a result, the time during which write voltage must be applied can be shortened and the operational speed or cycle time of the memory cell 1 thus improved.

So far, the effect of the write-bias means of the present invention has only been considered with respect to its benefits in increasing the speed of a write operation conducted by one port under circumstances where the other port has accessed the same row. However, the write-bias means of the present invention is turned on whenever a write operation is performed by either port, such that the bit-lines of the other port are charged by this means irrespective of addresses accessed.

However, the current supplied by the write-bias means is small enough in comparison with the current supplied by the precharge FETs 55, 57, and 61, 63 such that the latter dominate during the early part of a read operation. By the time the current from these precharge FETs has subsided, the differential voltage between the left-port bit-lines BL1 and BL2 or the right-port bit-lines BR1 and BR2 has risen to a value larger than needed by the differential sense amplifier. Consequently, the current from the write-bias means does not seriously slow a read operation. Similarly, the current from the write-bias means is also small enough to be dominated by the write-driver current from read-write circuits 27 and 29 such that any substantial interference with a write operation is also avoided.

The invention as thus far described has also been illustrated in a form suited to a dual-port SRAM having a very high degree of symmetry between its two ports. However, the invention is also applicable to other memory devices in which writing is always done from one port and reading from the other. The "First-In-First-Out" memory (FIFO) is such a device. It will be understood that in such cases, only one pair of write-bias gates needed be provided.

Similarly, the invention is also applicable to memory devices having more than two ports. For example, a tri-port device having three-way symmetry among its ports could make use of the invention of this application by providing each pair of bit-lines with a pair of write-bias gates, wherein the gate signal of each gate is a logically ORed function of the write signal on each of the other two ports. Other applications of the teachings of this invention will occur to workers skilled in the art.

Although this invention has been described with some particularly in reference to embodiments thereof which, taken as a whole, comprise the best mode known to the inventors for carrying out their invention, many changes could be made and many alternative embodiments could thus be derived without exceeding the scope of the invention. Consequently, the scope of the invention is to be determined only from the following claims.

We claim:

1. In a matrix-array read-write memory device of the type having a plurality of individually addressable discrete memory cells, having a plurality of discrete ports for accessing individual memory cells for writing or reading data in said memory cells, a memory cell accessible from a first and a second port, and including a bi-stable core cell having a first state representing a logic 1 bit and a second state representing a logic 0 bit and having a complementary pair of input-output terminals CC1 and CC2, a first-port word-select line and a second-port word-select line each coupled to said terminals CC1 and CC2, a first port column select input and a second port column select input each coupled to said terminals CC1 and CC2, a first-port bit-line BL1 and a second-port bit-line BR1 each coupled to said terminal CC1, a first-port bit-line BL2 and a second-port bit-line BR2 each coupled to said terminal CC2, and write circuit means coupled to the bit-lines of one of said ports and selectively operable to write data into said core cell by applying a logic 1 signal to one of said bit-lines and a logic 0 signal to the other of said bit-lines, said device further comprising:

gated write-bias means operating in cooperation with said write circuit means and coupled to one of said bit-lines to apply a write bias thereto, including a plurality of write-bias gates, one of said write-bias gates being provided for and associated with each of said plurality of ports, and wherein each of said write-bias gates is coupled between the bit-lines of its associated port and a source of logic-signal voltage, and further including means to cause each said gate to pass said logic-signal voltage to the bit-lines of its associated port in response to a write operation on another port, and to not pass said logic-signal voltage to the bit-lines of its associated port in the absence of a write operation on another port.

2. The device of claim 1 wherein said write-bias means comprises:

a source of logic-signal voltage, and a switch means, operable between a closed state and an open state and coupled between said source of logic-signal voltage and one of said bit-lines, to supply thereto said logic-signal voltage from said source when said switch means is closed.

3. The device of claim 2 wherein said switch means comprises an FET having source, drain and gate electrodes, and wherein one of said source and drain electrodes is connected to said source of logic-signal voltage and the other of said source and drain electrodes is connected to one of said bit-lines.

4. The device of claim 3 further including means to couple a logic 1 signal to said gate electrode for a preselected interval during the duration of said write signal.

5. The device of claim 2 wherein said source of logic-signal voltage supplies a logic 1 voltage level.

6. The device of claim 1 further comprising four pass-gates, and wherein each of said bit-lines coupled to one of the terminals of said core cell is so coupled by one of said four pass-gates.

7. The device of claim 6 wherein each of said pass-gates comprises an FET having source, gate and drain electrodes, and wherein one of said source and drain electrodes of each said pass-gate is connected to one of said bit-lines, and the other of said source and drain electrodes is connected to one of said core cell terminals.

8. The device of claim 7 wherein the gate electrode of one of said FETs connected to terminal CC1 is connected to said first-port word line, the gate electrode of the other of said FETs connected to terminal CC1 is connected to said second-port word line, the gate electrode of one of said FETs connected to terminal CC2 is connected to said first-port word line, and the gate electrode of the other of said FETs connected to terminal CC2 is connected to said second-port word line.

9. The device of claim 1 wherein said plurality of ports are two in number and said plurality of write-bias gates are two in number.

10. In a memory device having a plurality of memory cells, a first port and a second port, at least one of said cells being provided with a first pair of bit lines accessible to said first port and a second pair of bit-lines accessible to said second port, for reading binary data from said cell and writing data into said cell from said ports, a first write circuit means coupled to said first port for writing data into said one cell, the improvement comprising:

a first gated write-bias means operating in cooperation with said first write circuit means and coupled to one of said second pair of bit-lines to apply thereto a write bias in response to a write through the first port, a second write circuit means coupled to said second port for writing data into said one cell, and a second gated write-bias means operating in cooperation with said second write circuit means and coupled to one of said first pair of bit lines to apply thereto a write-bias in response to a write through the second port.

11. The memory device of claim 10 wherein said first gated write-bias means is coupled to each bit-line of said second pair of bit-lines.

12. The memory device of claim 11 wherein said first gated write-bias means comprises a first write-bias gate coupled between one of said first pair of bit-lines and a source of logic-signal voltage, and a second write-bias gate coupled between the other of said first pair of bit-lines and said source of logic-signal voltage.

13. The memory device of claim 12 further including means to cause said first write-bias gate to pass said logic-signal voltage to its coupled bit-line in response to a write operation on said first port, and to not pass said logic-signal voltage to its coupled bit-line in the absence of a write operation on said first port.

14. The memory device of claim 10 wherein said first gated write-bias means is coupled to each bit-line of said second pair and said second write-bias means is coupled to each bit-line of said first pair.

15. The memory device of claim 10 wherein said first gated write-bias means comprises a first write-bias gate coupled between a source of logic-signal voltage and one bit-line of said second pair, and further including means to cause said first write-bias gate to pass said logic-signal voltage to its coupled bit-line in response to a write operation on said first port, and to not pass said logic-signal voltage to its coupled bit-line in the absence of a write operation on said first port.

16. The memory device of claim 10 wherein said second gated write-bias means comprises a first write-bias gate coupled between a source of logic-signal voltage and one bit-line of said first pair, and further including means to cause said first write-bias gate to pass said logic-signal voltage to its coupled bit-line in response to a write operation on said second port, and to not pass said logic-signal voltage to its coupled bit-line in the absence of a write operation on said second port.

17. The memory device of claim 10 further including a second write circuit means coupled to said second port for writing data into said cell, the improvement further comprising:

said first gated write-bias means being coupled to each of said second pair of bit-lines to apply thereto a write bias;

a second gated write-bias means operating in cooperation with said second write circuit means and coupled to each of said first pair of bit-lines to apply thereto a write bias.

18. A memory device comprising:

an array of core cells storing data, each core cell having a terminal from which a state may be sensed that indicates the data stored in the core cell and through which the state of the core cell may be changed by applying a write bias to the terminal, the array including a plurality of predetermined subsets;

a first port, including a plurality of first bit lines, each first bit line corresponding to no more than one core cell in any predetermined subset, means for supplying first port cell select signals and first port subset select signals indicating respectively a selected first bit line in the plurality of first bit lines and a first selected subset in the plurality of predetermined subsets, means, responsive to first port cell select signals, for enabling the selected first bit line to be sensed or biased, means, responsive to first port subset select signals, for connecting each of the terminals of the first selected subset to first bit lines corresponding to the core cells in the first selected subset;

a second port, including a plurality of second bit lines, each second bit line corresponding to no more than one core cell in any predetermined subset, means for supplying second port cell select signals and second port subset select signals indicating respectively a selected second bit line in the plurality of second bit lines and a second selected subset in the plurality of predetermined subsets, means, responsive to second port cell select signals, for enabling the selected second bit line to be sensed or biased, means, responsive to second port subset select signals, for connecting each of the terminals of the second selected subset to second bit lines corresponding to core cells in the second selected subset;

first port read/write means, in cooperation with the first port, for sensing or biasing the plurality of first bit lines to effect reading or writing of data in selected core cells;

second port read/write means, in cooperation with the second port, for sensing or biasing the plurality of second bit lines to effect reading or writing of data in selected core cells;

first write bias means, in cooperation with the first port and connected to the plurality of second bit lines, for charging the second bit line corresponding to a given core cell during writing of data to the given core cell by the first read/write means; and second write bias mean, in cooperation with the second port and connected to the plurality of first bit lines, for charging the first bit line corresponding to a given cell during writing of data to the given cell by the second read/write means.

19. The memory device of claim 18, wherein each of the terminals of the core cells includes a complementary pair of nodes CC1, CC2; each of the first bit lines includes a first complementary pair of lines BR1, BR2; and each of the second bit lines includes a second complementary pair of lines BL1, BL2.

* * * * *